United States Patent
Gosser et al.

(10) Patent No.: US 6,653,961 B1
(45) Date of Patent: Nov. 25, 2003

(54) MULTIPLYING DIGITAL-TO-ANALOG CONVERTER STRUCTURES THAT REDUCE SIGNAL DISTORTION

(75) Inventors: Royal A. Gosser, Greensboro, NC (US); Edward Perry Jordan, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/272,758

(22) Filed: Oct. 16, 2002

Related U.S. Application Data

(60) Provisional application No. 60/379,333, filed on May 8, 2002, provisional application No. 60/379,383, filed on May 8, 2002, and provisional application No. 60/379,590, filed on May 8, 2002.

(51) Int. Cl.[7] .............................................. H03M 1/66
(52) U.S. Cl. ...................... 341/144; 341/135; 341/136
(58) Field of Search ................................ 341/135, 136, 341/144, 139

(56) References Cited

U.S. PATENT DOCUMENTS

| | | | | |
|---|---|---|---|---|
| 3,747,088 A | * | 7/1973 | Pastoriza | 341/145 |
| 3,857,021 A | * | 12/1974 | Wilensky et al. | 708/7 |
| 3,940,760 A | * | 2/1976 | Brokaw | 341/119 |
| 4,701,694 A | * | 10/1987 | Penney et al. | 323/317 |
| 5,128,674 A | * | 7/1992 | Kong et al. | 341/127 |
| 5,369,406 A | * | 11/1994 | Hughes | 341/135 |
| 5,631,647 A | * | 5/1997 | Huang | 341/136 |
| 5,835,039 A | * | 11/1998 | Giacomini | 160/178.1 R |
| 6,313,776 B1 | * | 11/2001 | Brown | 341/144 |

OTHER PUBLICATIONS

Hnatek, Eugene R., *A User's Handbook of D/A and A/D Converters*, John Wiley & Sons, New York, 1976, pp. 182–184.
Fink, Donald G., et al., *Electronic Engineer's Handbook*, McGraw–Hill, New York, Third Edition Oct. 1$^{st}$ 1998, pp. 8–71 to 8–73.
Horn, Jerry, "A 16–bit Mulitplying DAC,"Linear Technologies, Inc., 720 Sycamore Drive, Milpitas, California, 95035 Aug. 07, 2000.

* cited by examiner

*Primary Examiner*—Michael Tokar
*Assistant Examiner*—Khai Nguyen
(74) *Attorney, Agent, or Firm*—Koppel, Jacobs, Patrick & Keybl

(57) ABSTRACT

Mulitplying digital-to-analog converters (MDACs) are provided that reduce signal distortion without significantly raising current demand. These goals are achieved with input structures that lower input impedances and enhance the driving of nonlinear capacitances that are generally presented by the DAC portion of these devices.

36 Claims, 3 Drawing Sheets

MULTIPLYING DIGITAL-TO-ANALOG CONVERTER STRUCTURES THAT REDUCE SIGNAL DISTORTION

CROSS REFERENCES TO RELATED APPLICATIONS

This application refers to and claims the benefit of U.S. Provisional Applications Serial Nos. 60/379,333, 60/379,383 and 60/379,590 which were filed May 8, 2002.

BACKGROUND OF THE INVENTION

1. Field of the Invention

The present invention relates generally to digital-to-analog converters and, more particularly, to multiplying digital-to-analog converters.

2. Description of the Related Art

Digital-to-analog converters (DACs) convert digital input signals to corresponding analog output signals. In a typical DAC embodiment, an internal reference signal (e.g., a reference current) is mirrored to form a plurality of currents which flow through switches that respond to a digital input signal. The combined currents thus form an analog output current signal (which can, if desired, be converted to a voltage output signal) that has thereby been converted from the digital input signal.

In a multiplying digital-to-analog converter (MDAC), an input signal $S_{in}$ is received so as to modify the internal reference signal and thus the input signal $S_{in}$ is converted to an analog output signal $S_{out}$ with a conversion gain that corresponds to the digital signal which is now considered to be a digital command signal $S_{cmd}$.

MDACs have been found useful for a variety of applications (e.g., as the "attenuation core" in coaxial cable line drivers). However, it has also been found that conventional MDAC structures generally introduce distortion components into the analog output signal $S_{out}$. Although it has also been found that the distortion can be reduced by increasing current levels throughout the MDACs and by adding transistor current drivers (e.g., source followers), the first alteration decreases efficiency and raises component heating and the second has realized only moderate improvement.

BRIEF SUMMARY OF THE INVENTION

The present invention is directed to MDACs that reduce signal distortion without significantly raising current demand. These goals are achieved with input structures that lower input impedances and enhance the driving of nonlinear capacitances that are generally presented by the DAC portion of these devices.

The novel features of the invention are set forth with particularity in the appended claims. The invention will be best understood from the following description when read in conjunction with the accompanying drawings.

DETAILED DESCRIPTION OF THE INVENTION

In accordance with the present invention, it has been determined that multiplying digital-to-analog converters (MDACs) generally present nonlinear capacitances (e.g., from gate-to-drain and gate-to-source capacitances that vary with a changing input signal) to their input structures and it has also been found that these input structures typically have high input impedances. This combination has been found to be a significant source of the observed signal distortion.

Figure 1:
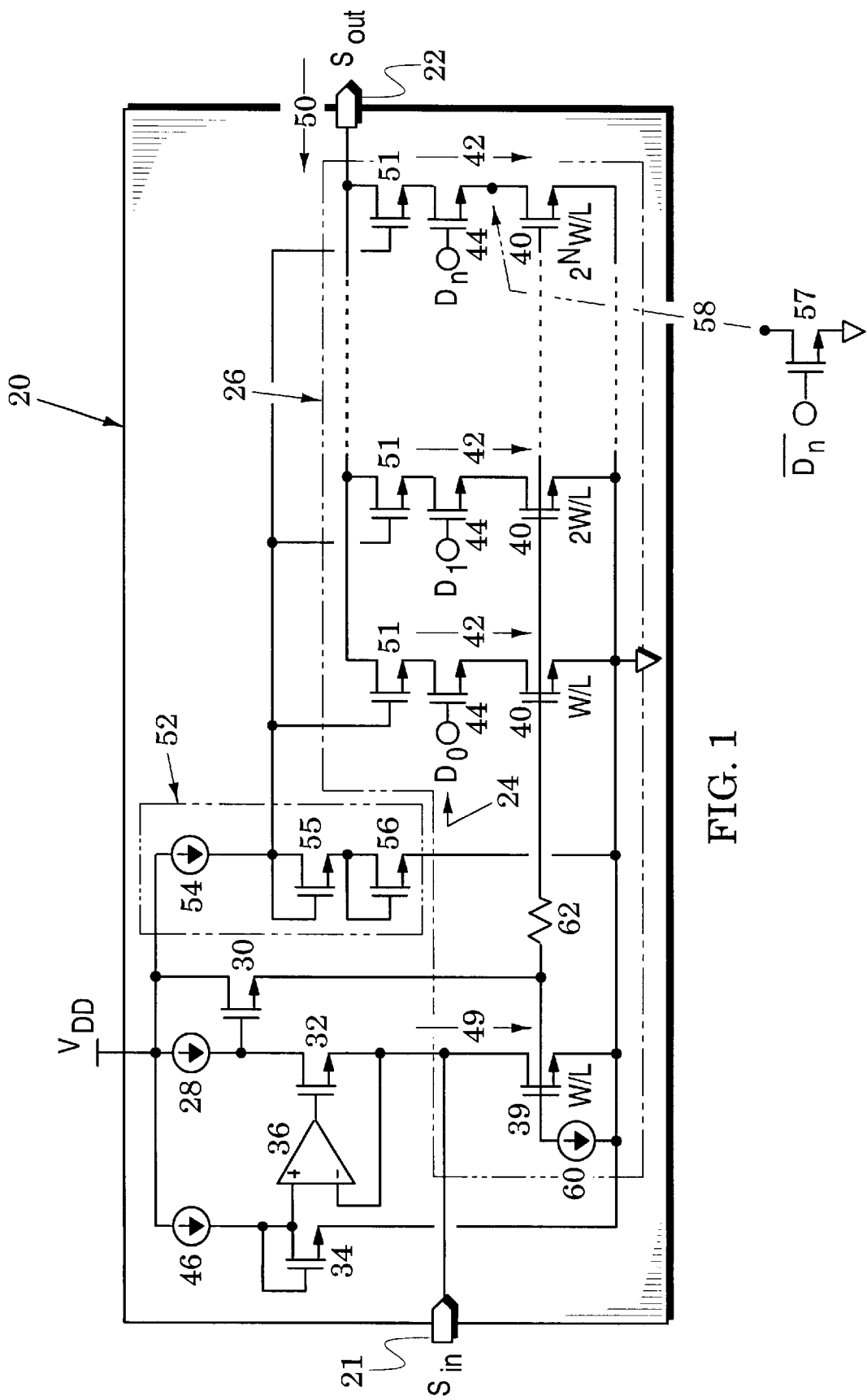
FIG. 1 is a schematic of an MDAC embodiment of the present invention.

Accordingly, FIG. 1 introduces an MDAC 20 which lowers input impedance and also provides enhanced current to drive the nonlinear capacitances to thereby reduce signal distortion without significantly raising current demand.

In particular, the MDAC 20 converts an input signal $S_{in}$ at an input port 21 to an analog output signal $S_{out}$ at an output port 22 with a conversion gain that corresponds to a digital command signal referenced as 24 and exemplified by its bits $D_0$–$D_n$. The MDAC 20 includes a digital-to-analog converter (DAC) 26, a main current source 28 (coupled to $V_{DD}$), a drive transistor 30, a pass transistor 32, a diode-coupled transistor 34 and a differential amplifier 36. The DAC 26 is formed with a reference transistor 39 and associated current mirror transistors 40 whose currents 42 are passed through switch transistors 44 in response to the digital command signal 24.

The drive transistor 30 has a drive control terminal (gate) and a drive current terminal (source) that responds to the drive control terminal wherein the drive control terminal is coupled to receive the main current source 28 and the drive current terminal is coupled to the reference control terminal of the reference transistor 39.

The pass transistor 32 has a pass control terminal (gate) and first and second pass current terminals (drain and source) that responds to the pass control terminal wherein the first pass current terminal is coupled to the main current source 28 and the second pass current terminal is coupled to the reference current terminal of the reference transistor 39.

A second current source 46 (coupled to $V_{DD}$) is preferably added to drive the diode-coupled transistor 34 and the differential amplifier 36 has a first input terminal (the noninverting input) coupled between the second current source and the diode-coupled transistor, a second input terminal (the inverting input) coupled to the reference current terminal of the reference transistor 39, and an output terminal coupled to drive the pass control terminal of the pass transistor 32

In operation of the DAC 26, the gate-to-source voltage $V_{gs}$ of the reference transistor 39 is associated with a refernce current 49 through the reference transistor and, because they share the same gate-to-source voltage $V_{gs}$, the current mirror transistors 40 mirror this current into the mirror currents 42. The mirror currents are passed through the switch transistors 44 in response to their respective bits ($D_0$–$D_n$) of the digital command signal 24. These mirrored currents add to form a current 50 (which is the analog output signal $S_{out}$) at the output port 22.

The current mirror transistors 40 are preferably protected with cascode transistors 51 that are coupled between the current mirror transistors and the output port 22. The control terminals of the cascode transistors are coupled to a junction between a bias current source 54 and a serially-coupled pair of diode-coupled transistors 55 and 56.

The bias current source 54 and the diode-coupled transistors form a reference 52 which thus establishes a potential of $V_{gs}$ at the drains of the switch transistors 44. This reduced potential safely limits the gate-to-drain voltage across the cascode transistors 51 (as the digital command signal 24 is coupled to the switch transistors 44) and they are accordingly protected from damage (e.g., gate oxide breakdown).

When a switch transistor 44 is turned off by its respective bit of the digital command signal 24, the potential of its source terminal is not established. Preferably, therefore, an auxiliary transistor 57 is inserted (as indicated by insertion arrow 58) between the source of a corresponding switch transistor 44 and ground. The auxiliary transistor responds to the inverse of the respective bit so that, when a switch transistor 44 is turned off, its source terminal has an established potential (e.g., ground).

In operation of the MDAC 20, the drive transistor 30 acts as a source follower and provides substantial current to drive the nonlinear capacitance at the control terminals (gates) of the reference transistor 39 and the current mirrors 40. The diode-coupled transistor 34 is biased by the current source 46 to establish a gate-to-source voltage $V_{gs}$ at the noninverting input of the differential amplifier 36. Because of the high gain of the differential amplifier and its coupled pass transistor 32, the negative feedback path about them will cause the voltage at the inverting input of the differential amplifier to substantially match the gate-to-source voltage $V_{gs}$ at the noninverting input. Accordingly, the impedance at the input port 21 is substantially reduced by the negative feedback and the potential at this port is established at a gate-to-source voltage $V_{gs}$.

The lowered input impedance and the increased current drive substantially reduces signal distortion at the output of the MDAC 20. Although modest current demand has been added (e.g., from the differential amplifier 36 and the diode-coupled transistor 34), the basic DC currents in the DAC 26 have not been altered. Signal distortion is thus substantially reduced without recourse to high currents which decrease efficiency and increase heating.

It was noted above that the reference 52 establishes a potential of $V_{gs}$ at the drains of the switch transistors 44. When these transistors are biased on by the digital command signal 24, they are essentially small resistors so that a potential of substantially $V_{gs}$ is also established at the drains of the mirror transistors 40. It has been found that the $V_{gs}$ bias is particularly suited for maintaining both the mirror transistors 40 and the cascode transistors 51 in their saturation region and that this further reduces signal distortion.

Because the drains of the mirror transistors and the drain of the reference transistor 39 are all at a similar potential of $V_{gs}$, current differences generated by $\lambda$ errors are reduced. The output impedance of integrated-circuit MOS transistors, for example, is less than infinity and, accordingly, different drain voltages will induce differences in the current relationship between the reference current 49 and the mirror currents 42.

The drive transistor 30 sources current to drive the nonlinear capacitance at the control terminals but it cannot sink current. Preferably, therefore, another current source 60 is coupled to the control terminal of the reference transistor 39 to sink current that further enhances the drive of the nonlinear capacitances and further reduces distortion.

Also, a resistor 62 is preferably inserted between the current terminal of the drive transistor 30 and the control terminals of the current mirror transistors 40 to enhance the stability of the circuit loop that includes the reference transistor 39 and the drive transistor 30.

The device sizes of the current mirror transistors 40 are generally scaled to appropriately set the step sizes of the analog output signal $S_{out}$. An exemplary scaling is indicated in FIG. 1 in which the reference transistor 39 has a W/L relationship in the width and length of its control terminal (gate). A first current mirror transistor 40 of FIG. 1 has the same W/L relationship so that its respective current 42 substantially matches the reference current 49 in the reference transistor.

However, a second current mirror transistor 40 has 2W/L relationship so that its respective current 42 is twice that of the reference current 49 to thereby realize a 6 dB increase in the analog output signal $S_{out}$. An additional 6 dB increase is realized in each added mirror transistor so that a last Nth added mirror transistor has a $2^N$W/L relationship in the width and length of its control terminal (to facilitate fabrication, it may be desirable to fabricate unit transistors and realize the increased W/L relationship by simply combining an appropriate number of unit transistors). The current mirrors are thus sized to provide binarily-weighted currents.

It is noted that this device scaling sets the DC currents of the analog output signal $S_{out}$ with respect to the digital command signal 24. The input signal $S_{in}$ at the input port 21 is preferably a current signal which adds to and subtracts from the reference current 49 of the reference transistor 39. Accordingly, this input AC current will be mirrored by the mirror transistors 40 and appear as the analog output signal $S_{out}$ at the output port 22. As each additional current mirror transistor 40 is turned on by the digital command signal 24, the output AC current will increase an additional 6 dB.

In the exemplary scaling described above, a one-to-one relationship was initially set between the size of the reference transistor 39 and a first current mirror transistor 40. It should be apparent, however, that this relationship can be altered in other embodiments of the invention without affecting the current relationships established between the various current mirror transistors.

Figure 2:
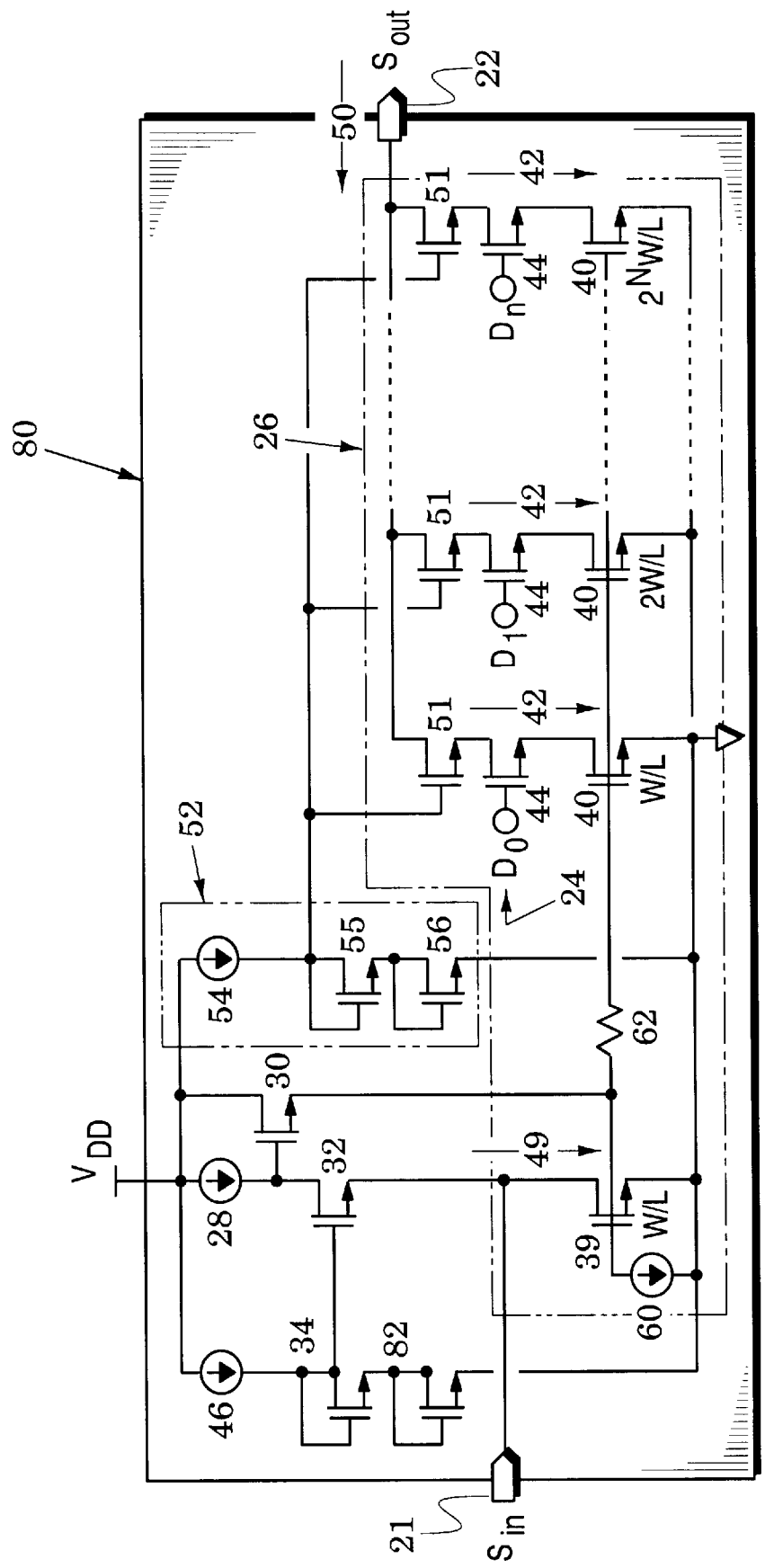
FIG. 2 is a schematic of another MDAC embodiment of the present invention.

FIG. 2 illustrates another MDAC 80 which includes elements of the MDAC 20 of FIG. 1 with like elements indicated by like reference numbers. In contrast, however, the MDAC 80 adds a diode-coupled transistor 82 in series with the diode-coupled transistor 34, eliminates the differential amplifier 36 and couples the control terminal of the pass transistor 32 directly to the junction between the current source 46 and the diode-coupled transistor 34.

In operation of the MDAC 80, the added diode-coupled transistor 82 maintains the potential of $V_{gs}$ at the current terminal of the reference transistor 39 and the pass transistor 32 lowers the impedance at the input port 21 while the drive transistor 30 continues to drive the nonlinear capacitance at the control terminals of the mirror transistors 40 (with the sink aid of the additional current source 60).

Figure 3:
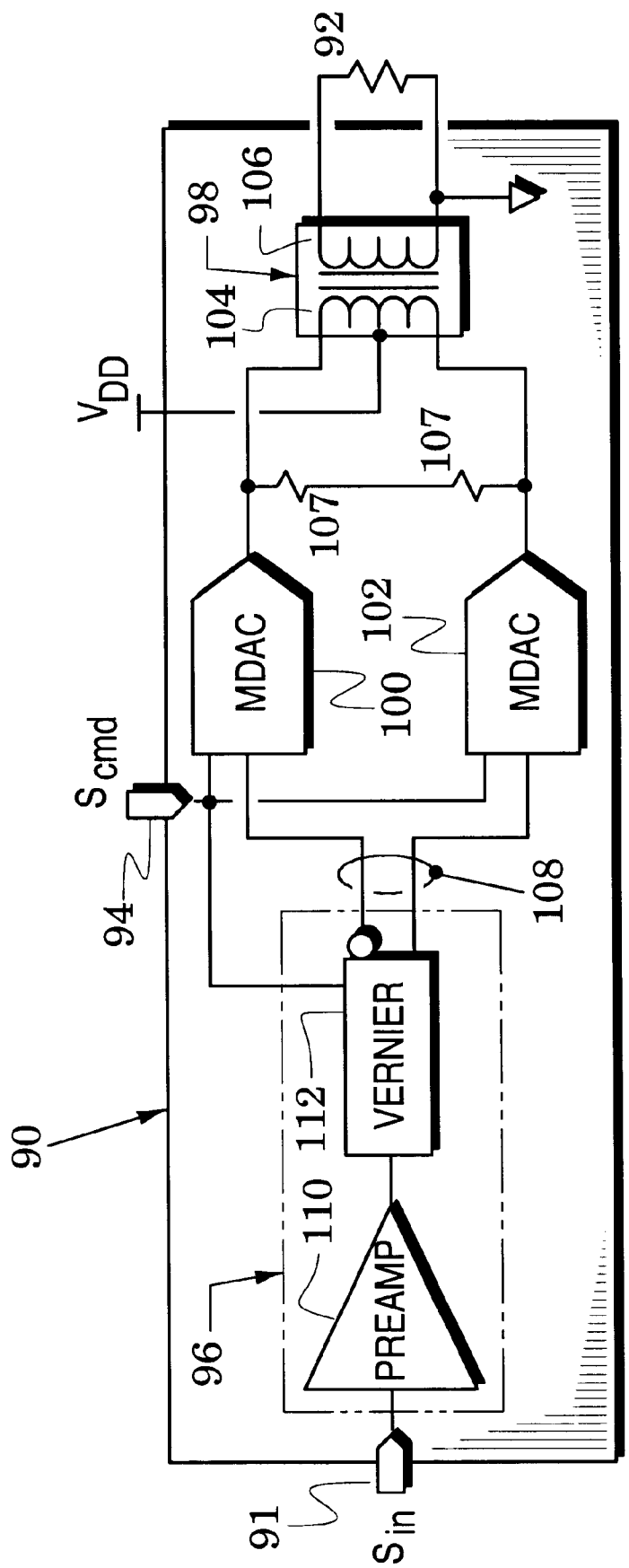
FIG. 3 is block diagram of a line driver embodiment of the present invention.

FIG. 3 illustrates a line driver embodiment 90 which is particularly suited for driving load impedances (e.g., the 75 ohm impedance of a coaxial cable) and is thus useful in a variety of communication applications (e.g., as a line driver in a cable modem).

In particular, the line driver 90 responds to a driver input signal $S_{in}$ at an input port 91 and drives a load impedance 92 with a gain that corresponds to a digital command signal $S_{cmd}$ at a command port 94. The line driver includes a buffer amplifier 96, a transformer 98 and first and second MDACs 100 and 102.

The transformer 98 includes an input (primary) winding 104 which has a center tap to receive a bias voltage source $V_{DD}$ and has an output (secondary) winding 106 which is coupled across the load impedance 92 (which may represent the impedance of a coaxial cable). Resistors 107 are preferably coupled across the input winding to enhance impedance matching across the transformer 98.

In response to the differential input signal $S_{in}$, the buffer amplifier generates a differential buffer signal 108 and each of the MDACs 100 and 102 is arranged to receive a respective side of the differential buffer signal 108 and drive a respective side of the input winding 104. If the differential buffer signal has a DC component, then a corresponding DC output current flows through a corresponding side of the input winding 104 from the bias source $V_{DD}$.

In response to the differential input signal $S_{in}$, therefore, each of the MDACs 100 and 102 generates an AC current signal whose phase is spaced 180° from the phase of an AC current signal from the other MDAC. Accordingly, an AC output current signal flows through the input winding and the transformer generates an output current signal which flows through the load impedance 92.

In a line driver embodiment, the buffer amplifier 96 is formed by a preamplifier 110 and a vernier 112. The preamplifier receives the line driver input signal and the vernier responds to an output signal from the preamplifier and provides the differential buffer signal 108 with a gain that corresponds to the digital command signal $S_{cmd}$.

In an exemplary line driver embodiment, each of the MDACs 100 and 102 would be configured to provide 6 dB steps in the AC output current signal (through the input winding 104) and the vernier would be configured to provide 1 dB steps which would thus provide an AC output current signal with a 1 dB resolution.

Conventional line drivers generally include a power amplifier as a final stage to drive the load impedance 90. The power amplifier necessarily adds signal noise and signal distortion and increases size and power dissipation. The line driver 90 removes the need for this amplifier and thus substantially eliminates its degrading effects.

When MDAC embodiments of the present invention (e.g., the MDAC 20 of FIG. 1) are used for the MDACs 100 and 102, the signal fidelity of the line driver is also improved because these MDACs substantially reduce the signal distortion of conventional MDACs.

The concept of gain has been used in the above description of embodiments of the invention. It is intended that this concept is broadly interpreted and it, accordingly, refers to any change of signal amplitude whether that change is an increase or a decrease of signal amplitude.

Although MDAC embodiments have been illustrated with MOS transistors, the teachings of the invention can be practiced with various transistor types (e.g., bipolar junction transistors).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A multiplying digital-to-analog converter (MDAC) that converts an input signal to an analog output signal with a conversion gain that corresponds to a digital command signal, comprising:

a digital-to-analog converter that includes a reference transistor and associated current mirrors whose currents are passed in response to said digital command signal to form said analog output signal wherein said reference transistor has a reference control terminal and a reference current terminal that receives said input signal;

a main current source;

a drive transistor that has a drive control terminal and a drive current terminal wherein said drive control terminal is coupled to said main current source and said drive current terminal is coupled to said reference control terminal;

a pass transistor coupled between said main current source and said reference current terminal;

a diode-coupled transistor; and a differential amplifier that has a first input terminal coupled to said diode-coupled transistor and a second input terminal coupled to said reference current terminal and also has an output terminal coupled to drive said pass transistor.

2. The MDAC of claim 1, further including a second current source coupled to said reference control terminal to provide current that complements current from said drive transistor.

3. The MDAC of claim 1, further including a third current source coupled to bias said diode-coupled transistor.

4. The MDAC of claim 1, further including a resistor inserted between said drive current terminal and said current mirrors to enhance stability.

5. The MDAC of claim 1, wherein said reference transistor, said current mirrors, said drive transistor, said pass transistor and said diode-coupled transistor are metal-oxide-semiconductor (MOS) transistors.

6. A multiplying, digital-to-analog converter (MDAC) that converts an input signal to an analog output signal with a conversion gain that corresponds to a digital command signal, comprising:

a digital-to-analog converter that includes a reference transistor and associated current mirrors whose currents are passed in response to said digital command signal to form said analog output signal wherein said reference transistor has a reference control terminal and also has a reference current terminal that receives said input signal;

a main current source;

a drive transistor that has a drive control terminal and a drive current terminal wherein said drive control terminal is coupled to said main current source and said drive current terminal is coupled to said reference control terminal;

a pass transistor that has a pass control terminal and first and second pass current terminals with said first pass current terminal coupled to said main current source and said second pass current terminal coupled to said reference current terminal; and serially-connected first and second diode-coupled transistors coupled to bias said pass control terminal.

7. The MDAC of claim 6, further including a second current source coupled to said reference control terminal to provide current that complements current from said drive transistor.

8. The MDAC of claim 6, further including a third current source coupled to bias said first and second diode-coupled transistors.

9. The MDAC of claim 6, further including a resistor inserted between said drive current terminal and said current mirrors to enhance stability.

10. The MDAC of claim 6, wherein said reference transistor, said current mirrors, said drive transistor, said pass transistor and said first and second diode-coupled transistors are metal-oxide-semiconductor (MOS) transistors.

11. A multiplying digital-to-analog converter (MDAC) that converts an input signal to an analog output signal with a conversion gain that corresponds to a digital command signal, comprising:

a reference transistor that has a reference control terminal and also has a reference current terminal that receives said input signal;

a plurality of current mirrors coupled to said reference control terminal;

a plurality of transistor switches that respond to said digital command signal and are each coupled in series with a corresponding one of said current mirrors;

a main current source;

a drive transistor that has a drive control terminal and a drive current terminal wherein said drive control terminal is coupled to said main current source and said drive current terminal is coupled to said reference control terminal;

a pass transistor coupled between said main current source and said reference current terminal;

a diode-coupled transistor; and a differential amplifier that has a first input terminal coupled to said diode-coupled transistor and a second input terminal coupled to said reference current terminal and also has an output terminal coupled to drive said pass transistor.

12. The MDAC of claim 11, further including:

a second current source coupled to said reference control terminal to provide current that complements current from said drive transistor; and a third current source coupled to bias said diode-coupled transistor.

13. The MDAC of claim 11, further including a resistor inserted between said drive current terminal and said current mirrors to enhance stability.

14. The MDAC of claim 11, wherein said reference transistor, said current mirrors, said transistor switches, said drive transistor, said pass transistor and said diode-coupled transistor are metal-oxide-semiconductor (MOS) transistors.

15. The MDAC of claim 11, wherein said reference control terminal and said drive control terminal are gates, said reference current terminal is a drain and said drive current terminal is a source.

16. The MDAC of claim 11, wherein said current mirrors are sized to provide binarily-weighted currents.

17. A multiplying digital-to-analog converter (MDAC) that converts an input signal to an analog output signal with a conversion gain that corresponds to a digital command signal, comprising:

a reference transistor that has a reference control terminal and also has a reference current terminal that receives said input signal;

a plurality of current mirrors coupled to said reference control terminal;

a plurality of transistor switches that respond to said digital command signal and are each coupled in series with a corresponding one of said current mirrors;

a main current source;

a drive transistor that has a drive control terminal and a drive current terminal wherein said drive control terminal is coupled to said main current source and said drive current terminal is coupled to said reference control terminal;

a pass transistor that has a pass control terminal and first and second pass current terminals with said first pass current terminal coupled to said main current source and said second pass current terminal coupled to said reference current terminal; and serially-connected first and second diode-coupled transistors coupled to bias said pass control terminal.

18. The MDAC of claim 17, further including:

a second current source coupled to said reference control terminal to provide current that complements current from said drive transistor; and a third current source coupled to bias said first and second diode-coupled transistors.

19. The MDAC of claim 17, further including a resistor inserted between said drive current terminal and said current mirrors to enhance stability.

20. The MDAC of claim 17, wherein said reference transistor, said current mirrors, said transistor switches, said drive transistor, said pass transistor and said diode-coupled transistors are metal-oxide-semiconductor (MOS) transistors.

21. The MDAC of claim 17, wherein said reference control terminal, said drive control terminal and said pass control terminal are gates, said reference current terminal and said first pass current terminal are drains and said drive current terminal and said second pass current terminal are sources.

22. The MDAC of claim 17, wherein said current mirrors are sized to provide binarily-weighted currents.

23. A line driver that responds to a driver input signal and drives a load impedance with a gain that corresponds to a digital command signal, comprising:

a buffer amplifier that generates a differential buffer signal in response to said driver input signal;

a transformer that has an input winding and also has an output winding for coupling across said load impedance; and first and second multiplying digital-to-analog converters (MDACs) that are each coupled to receive a respective side of said differential buffer signal and drive a respective side of said input winding;

wherein each of said MDACs includes:

a) a digital-to-analog converter that includes a reference transistor and associated current mirrors whose currents are passed to said respective side of said input winding in response to said digital command signal wherein said reference transistor has a reference control terminal and also has a reference current terminal that receives said respective side of said differential buffer signal;

b) a main current source;

c) a drive transistor that has a drive control terminal and a drive current terminal wherein said drive control terminal is coupled to said main current source and said drive current terminal is coupled to said reference control terminal;

d) a pass transistor coupled between said main current source and said reference current terminal;

e) a diode-coupled transistor; and f) a differential amplifier that has a first input terminal coupled to said diode-coupled transistor and a second input terminal coupled to said reference current terminal and also has an output terminal coupled to drive said pass transistor.

24. The line driver of claim 23, wherein said buffer amplifier includes:

a preamplifier that receives said driver input signal; and a vernier that responds to said preamplifier and generates said differential buffer signal with a gain that corresponds to said digital command signal.

25. The line driver of claim 23, further including a third current source coupled to bias said diode-coupled transistor.

26. The line driver of claim 23, further including a resistor inserted between said drive current terminal and said current mirrors to enhance stability.

27. A line driver that responds to a driver input signal and drives a load impedance with a gain that corresponds to a digital command signal, comprising:
- a buffer amplifier that generates a differential buffer signal in response to said driver input signal;
- a transformer that has an input winding and also has an output winding for coupling across said load impedance; and
- first and second multiplying digital-to-analog converters (MDACs) that are each coupled to receive a respective side of said differential buffer signal and drive a respective side of said input winding;

wherein each of said MDACs includes:
  a) a digital-to-analog converter that includes a reference transistor and associated current mirrors whose currents are passed to said respective side of said input winding in response to said digital command signal wherein said reference transistor has a reference control terminal and also has a reference current terminal that receives said respective side of said differential buffer signal;
  b) a main current source;
  c) a drive transistor that has a drive control terminal and a drive current terminal wherein said drive control terminal is coupled to said main current source and said drive current terminal is coupled to said reference control terminal;
  d) a pass transistor that has a pass control terminal and first and second pass current terminals with said first pass current terminal coupled to said main current source and said second pass current terminal coupled to said reference current terminal; and
  e) serially-connected first and second diode-coupled transistors coupled to bias said pass control terminal.

28. The line driver of claim 27, wherein said buffer amplifier includes:
- a preamplifier that receives said driver input signal; and
- a vernier that responds to said preamplifier and generates said differential buffer signal with a gain that corresponds to said digital command signal.

29. The line driver of claim 27, further including a third current source coupled to bias said diode-coupled transistor.

30. The line driver of claim 27, further including a resistor inserted between said drive current terminal and said current mirrors to enhance stability.

31. A multiplying digital-to-analog converter (MDAC) that converts an input signal to an analog output signal with a conversion gain that corresponds to a digital command signal, comprising:
- a digital-to-analog converter that includes a reference transistor and associated current mirrors whose currents are passed in response to said digital command signal to form said analog output signal wherein said reference transistor has a reference control, terminal and has a reference current terminal that receives said input signal;
- a drive transistor coupled to provide current to said reference control terminal;
- a pass transistor that has a pass control terminal and also has a pass current terminal coupled to said reference current terminal; and
- a differential amplifier that has a first input terminal which receives a bias signal, has a second input terminal coupled to said reference current terminal and has an output terminal coupled to said pass control terminal.

32. The converter of claim 31, further including a diode-coupled transistor coupled to provide said bias signal.

33. The converter of claim 31, wherein said drive transistor is a mietal-oxide-semiconductor (MOS) transistor and is coupled as a source follower.

34. A multiplying digital-to-analog converter (MDAC) that converts an input signal to an analog output signal with a conversion gain that corresponds to a digital command signal, comprising:
- a digital-to-analog converter that includes a reference transistor and associated current mirrors whose currents are passed in response to said digital command signal to form said analog output signal wherein said reference transistor has a reference control terminal and also has a reference current terminal that receives said input signal;
- a drive transistor coupled to provide current to said reference control terminal; and
- a pass transistor coupled to provide current to said reference current terminal.

35. The converter of claim 34, further including first and second diode-coupled transistors that are serially coupled to form a bias junction between them and wherein said pass transistor has a pass control terminal coupled to said bias junction and has a pass current terminal coupled to said reference current terminal.

36. The converter of claim 34, wherein said drive transistor is a metal-oxide-semiconductor (MOS) transistor and is coupled as a source follower.

* * * * *